United States Patent [19]

Nagai

[11] Patent Number: 4,921,812
[45] Date of Patent: May 1, 1990

[54] PROCESS OF FABRICATING FIELD EFFECT TRANSISTOR DEVICE

[75] Inventor: Taku Nagai, Shizuoka, Japan

[73] Assignee: Yamaha Corporation, Hamamatsu, Japan

[21] Appl. No.: 305,771

[22] Filed: Feb. 3, 1989

[30] Foreign Application Priority Data

Feb. 5, 1988 [JP] Japan .................................. 63-24986

[51] Int. Cl.⁵ .......................................... H01L 21/265
[52] U.S. Cl. .......................................... 437/35; 437/44
[58] Field of Search .............................. 437/35, 41, 44

[56] References Cited

U.S. PATENT DOCUMENTS 4,232,439 11/1980 Shibata ................... 437/35
4,539,580 9/1985 Matsunaga .......... 357/23.6
4,771,012 9/1988 Yabu et al. ............. 437/29

FOREIGN PATENT DOCUMENTS 62-274714 11/1987 Japan ...................... 437/35
63-41019 2/1988 Japan ...................... 437/35
63-233567 9/1988 Japan .

OTHER PUBLICATIONS

"The Improvement of Characteristics of LDD Tr. by Oblique-Rotating Ion Implantation".

Primary Examiner—Olik Chaudhuri
Attorney, Agent, or Firm—Burns, Doane, Swecker & Mathis

[57] ABSTRACT

A process of fabricating a semiconductor integrated circuit device, wherein a semiconductor wafer having a number of isolated active areas has a gate insulator layer located within each active area and defining regions to form source and drain regions, respectively, and a gate electrode layer formed on the gate insulator layer, and wherein dopant ions are injected into the source- and drain-forming regions in two steps consisting of a first step of injecting dopant ions in a first direction inclined through a predetermined angle from normal to the surface of the wafer, the first direction having on a plane parallel with the surface of the wafer a projective component angled to the direction of length of the gate electrode layer, the dopant ions being injected into the source- and drain-forming regions with a dose equal to one-half of the total dose required for the formation of the source and drain regions, and a second step of injecting dopant ions in a second direction inclined through the predetermined angle from normal to the surface of the wafer, the second direction having on the plane parallel with the surface of the wafer a projective component angled to the direction of length of the gate electrode layer and diametrically opposite to the projective component of the first direction, the dopant ions being injected into the source- and drain-forming regions with a dose equal to the remaining half of the required total dose.

4 Claims, 1 Drawing Sheet

PRIOR-ART

PROCESS OF FABRICATING FIELD EFFECT TRANSISTOR DEVICE

FIELD OF THE INVENTION

The present invention relates to a process of fabricating a semiconductor integrated circuit device typically including a multiplicity of metal-oxide-semiconductor (MOS) field-effect transistors. More particularly, the present invention relates to improvements in the techniques of ion implantation for forming source and drain regions of MOS field-effect transistors in a process of fabricating such a semiconductor integrated circuit device.

BACKGROUND OF THE INVENTION

During fabrication of a semiconductor integrated circuit device having a multiplicity of MOS field-effect transistors, dopant ions of either the acceptor or donor type are injected into the source-forming and drain-forming areas defined for each of the transistors to be fabricated. To minimize the ion channeling effect, the dopant ions are usually injected into the silicon wafer with an ion beam incident on the silicon wafer at a certain angle slightly off normal to the surface of the wafer. The dopant ions being thus incident on the silicon wafer in a direction deviated from normal to the surface of the wafer, there is present a zone sheltered from the beam of ions behind an edge portion of the gate electrode layer located between the source-forming and drain-forming areas of the wafer. No ions are injected into the portion of the source-forming or drain-forming area of the silicon wafer underlying such a sheltered zone so that the portion of the source or drain region which has thus failed to be implanted in one transistor may differ in geometry from that in another transistor. This results in nonuniformity in the performance characteristics of the individual transistors on the silicon wafer. In addition, each of the transistors on the silicon wafer would have performance characteristics which differ depending on which of the source and drain regions has the portion having failed to be implanted.

These problems may be solved by the use of ion implantation techniques in which ions are injected into a silicon wafer rotating about an axis therethrough. To implement such techniques, however, it is required to provide in the ion implantation system an additional mechanism for driving the wafer for rotation at a controlled speed. The provision of such an extra mechanism results in added intricacy of the system configuration and in increased production and maintenance costs of the system.

SUMMARY OF THE INVENTION

It is, accordingly, an important object of the present invention to provide an improved process of fabricating a semiconductor integrated circuit device which features formation of transistors having uniformity of performance characteristics.

It is another important object of the present invention to provide an improved process of fabricating a semiconductor integrated circuit device which features formation of transistors each having symmetrical source and drain performance characteristics.

It is still another important object of the present invention to provide an improved process of fabricating a semiconductor integrated circuit device with use of a simple and economical fabrication system not including means for driving a wafer during ion implantation.

In accordance with the present invention, there is provided a process of fabricating a semiconductor integrated circuit device, comprising the steps of (a) forming on a semiconductor wafer a plurality of active areas which are electrically isolated from each other, (b) forming on the semiconductor wafer a gate insulator layer located within each of the active areas, the gate insulator layer defining source-forming and drain-forming regions to form source and drain regions, respectively, on both sides of the gate insulator layer, (c) forming a gate electrode layer on the gate insulator layer within each of the active areas, and (d) introducing dopant ions selectively into the source-forming and drain-forming regions with the gate electrode layer used as a mask for thereby forming the source and drain regions, respectively, within each of the active areas, wherein the dopant ions are selectively introduced into the source-forming and drain-forming regions in consecutive two steps which consist of (d/1) a first step of introducing dopant ions into the source-forming and drain-forming regions within each of the active areas in a first direction inclined through a predetermined angle from normal to the surface of the semiconductor wafer, the first direction having on a plane parallel with the surface of the semiconductor wafer a projective component angled to the direction of length of the gate electrode layer in each of the active areas, the dopant ions being introduced into the source-forming and drain-forming regions in the first direction with a dose substantially equal to one half of the total dose required for the formation of the source and drain regions, and (d/2) a second step of introducing dopant ions into the source-forming and drain-forming regions within each of the active areas in a second direction inclined through the predetermined angle from normal to the surface of the semiconductor wafer, the second direction having on the plane parallel with the surface of the semiconductor wafer a projective component angled to the direction of length of the gate electrode layer in each of the active areas and diametrically opposite to the projective component of the first direction, the dopant ions being introduced into the source-forming and drain-forming regions in the second direction with a dose substantially equal to the remaining half of the total dose required for the formation of the source and drain regions.

In a process according to the present invention, the projective component of each of the first and second directions is preferably inclined through 45 degrees from the direction of length of the gate electrode layer in each of the active areas.

The dopant ions to be injected into the wafer are supplied from a source of dopant ions fixedly held in position with respect to the semiconductor wafer during each of the first and second steps. In this instance, the relative position between the semiconductor wafer and the source of dopant ions is inversed in diametrically opposite relationship upon termination of the first step. For this purpose, the semiconductor wafer may be turned through 180 degrees with respect to the source of dopant ions with the source of dopant ions fixedly held in situ upon termination of the first step.

BRIEF DESCRIPTION OF THE DRAWINGS

The drawbacks of a prior-art process of fabricating a semiconductor integrated circuit device and the features and advantages of a process according to the present invention will be more clearly understood from the following description taken in conjunction with the accompanying drawings in which.

DESCRIPTION OF THE PRIOR ART

Description will be hereinafter made with reference to FIG. 1 in regard to mode detailed aspects of a known self-aligned process of fabricating a semiconductor integrated circuit device.

Figure 1:
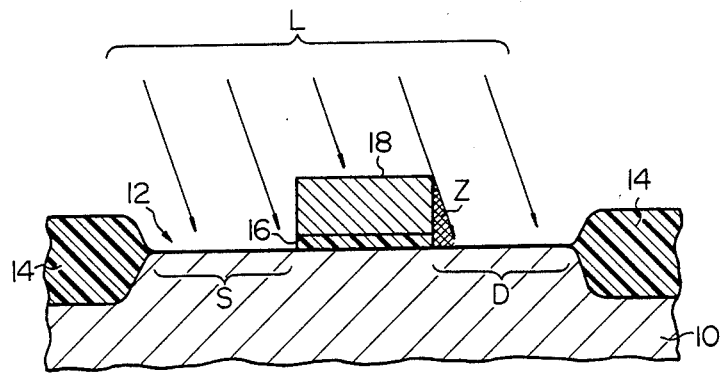
FIG. 1 is a fragmentary sectional view showing a portion of a semiconductor structure having MOS field-effect transistors being fabricated by a known self-aligned fabrication process.

Referring to FIG. 1, a semiconductor structure is shown having a silicon wafer 10 on which is to be fabricated a MOS field-effect transistor by a known self-aligned fabrication process. The field-effect transistor herein shown is one of a multiplicity of similar transistor devices and is provided in an active area 12 defined in the silicon wafer 10 by a field oxide layer 14 typically formed by local-oxidation-of-silicon (LOCOS) process. In the active area 12 of the silicon wafer 10 is located a gate oxide layer 16 which underlies a gate electrode layer 18 of typically polysilicon and which defines areas S and D in which source and drain regions of the transistor are to be formed.

With the field oxide layer 14 and the gate electrode layer 18 used as masks, dopant ions of either the acceptor or donor type are injected into these source-forming and drain-forming areas S and D of the silicon wafer 10 through irradiation with a beam L of dopant ions. In order to minimize the ion channeling effect, the dopant ion beam L is incident on the silicon wafer 10 at a certain angle $\ominus$ slightly off normal to the surface of the wafer 10.

The dopant ions being thus incident on the silicon wafer 10 in a direction deviated from normal to the surface of the wafer 10, there is present a zone Z sheltered from the beam L of ions behind an edge portion of the gate electrode layer 18. Into the portion of the source-forming or drain-forming area S or D of the silicon wafer 10 underlying this sheltered zone Z are injected no ions which contribute to formation of the source or drain region of the transistor.

As well known in the art, the MOS field-effect transistors fabricated on a silicon wafer are arranged so that the gate electrode layer of one transistor has a length directed perpendicularly to the length of the gate electrode layer of another transistor. If the portion of the source or drain region which has thus failed to be implanted with ions due to the presence of the sheltered zone Z in one transistor differs in geometry from that in another transistor, there would result nonuniformity in the performance characteristics of the individual transistors. For each of the transistors formed on a silicon wafer, furthermore, the transistor would have performance characteristics which differ depending on which of the source and drain regions has the portion having failed to be implanted.

With a view to solving these problems, ion implantation techniques have been proposed in which ions are injected into a silicon wafer rotating about an axis therethrough. Such ion implantation techniques however have a problem in that the ion implantation system to be used to implement such techniques requires provision of an additional mechanism for driving the wafer for rotation at a controlled speed. The provision of such an additional mechanism results in added intrication of the system configuration and in increased production and maintenance costs of the system.

DESCRIPTION OF THE PREFERRED EMBODIMENT

Figure 2:
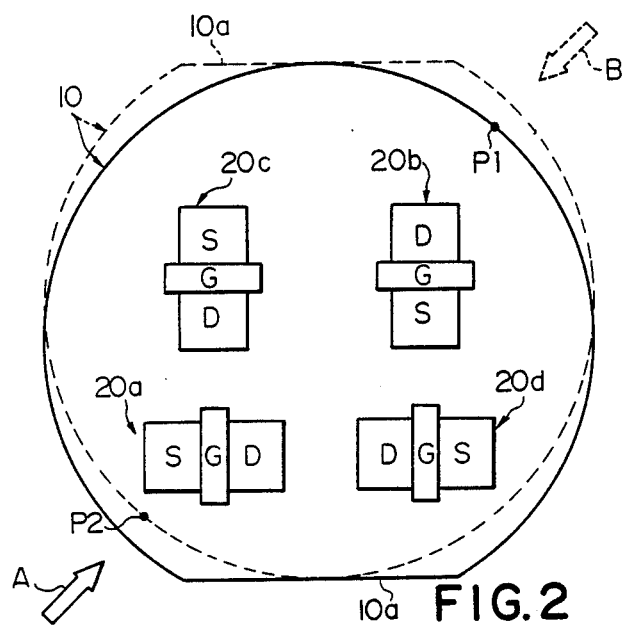
FIG. 2 is a plan view schematically showing a semiconductor wafer having MOS field-effect transistor being fabricated by a process according to the present invention.

FIG. 2 schematically shows a semiconductor wafer having MOS field-effect transistors being fabricated by a process according to the present invention.

Referring to FIG. 2, a semiconductor structure is shown comprising a silicon wafer 10 which has a plurality of active areas 20a, 20b, 20c and 20d each defined by a field oxide layer (not shown) as in the semiconductor structure described with reference to FIG. 1. The active areas 20a, 20b, 20c and 20d herein shown are simply representative of a multiplicity of such areas provided in the silicon wafer 10. In each of the active areas 20a, 20b, 20c and 20d of the silicon wafer 10 are located source-forming and drain-forming areas S and D which are defined by a gate oxide layer (not shown) which underlies a gate electrode layer G of typically polysilicon. The silicon wafer 10 has a straight edge portion forming an orientation flat 10a from which will be known the relative position of the silicon wafer 10 in an ion implantation system (not shown) into which the wafer 10 is assumed to be loaded. The individual active areas 20a, 20b, 20c and 20d of the silicon wafer 10 are located in rows parallel with the orientation flat 10a. With respect to the orientation flat 10a of the silicon wafer 10, the active areas 20c and 20b are oriented to have the lengths of their gate electrode layers G directed in parallel with the orientation flat 10a, while the active areas 20a and 20d are oriented to have the lengths of their gate electrode layers G directed at right angles to the orientation flat 10a. Accordingly, the gate electrode layer G of each of the the active areas 20a and 20d has its direction of length angled perpendicularly to the direction of length of the gate electrode layer G of each of the active areas 20c and 20b.

Dopant ions of either the acceptor or donor type are injected into the source-forming and drain-forming areas S and D of each of the active areas 20a, 20b, 20c and 20d thus located in the silicon wafer 10 the silicon wafer 10. The dopant ions to be injected into the areas S and D may be those of, for example, phosphorus where a MOS field-effect transistor of the n-channel type is to be fabricated or may be those of, for example, boron where a MOS field-effect transistor of the p-channel type is to be fabricated. In accordance with the present invention, such dopant ions are injected into each active area through irradiation with a beam of dopant ions in consecutive two steps.

During the first step of ion implantation, the ion beam is incident on the silicon wafer 10 in a first direction which is inclined through a predetermined angle from normal to the surface of the wafer 10. The first direction in which the dopant ions are thus injected into each of the active areas has on a plane parallel with the surface of the silicon wafer 10 a projective component angled to or, in other words, not parallel with the direction of length of the gate electrode layer G in every one of the active areas 20a, 20b, 20c and 20d of the silicon wafer 10 as indicated by arrow "A". It may be noted that, during the first step of ion implantation, dopant ions are injected, for each of the transistors to be fabricated, with a dose equal to one half of the total dose required for the formation of the source and drain regions for the field-effect transistor.

The dopant ions being thus incident on the silicon wafer 10 in a direction deviated from normal to the surface of the wafer 10, there is present a zone sheltered from the beam of ions behind an edge portion of the gate electrode layer G in each of the active areas 20a, 20b, 20c and 20d of the silicon wafer 10. Into the portion of the source-forming or drain-forming area S or D of the silicon wafer 10 underlying this sheltered zone are thus injected no ions to contribute to formation of the source or drain region of the transistor, as in the prior-art ion implantation process described with reference to FIG. 1.

The dopant ions to be injected into the silicon wafer 10 are supplied from a suitable source (not shown) of dopant ions which is fixedly held in position with respect to the silicon wafer 10 during the first step of ion implantation. Upon termination of the first step of ion implantation, the relative position between the silicon wafer 10 and the source of dopant ions is inversed in diametrically opposite relationship. For this purpose, the silicon wafer 10 may be turned through 180 degrees with respect to the source of dopant ions with the source of dopant ions fixedly held in situ within the ion implantation system. In this instance, the silicon wafer 10 has a relative position indicated by broken lines in FIG. 2 so that, if it is assumed that the silicon wafer 10 had a point located as indicated at $P_1$ during the first step of ion implantation, the same point is located as indicated at $P_2$ during the second step of ion implantation.

During the second step of ion implantation, the ion beam is incident on the silicon wafer 10 in a second direction which is inclined through the predetermined angle from normal to the surface of the wafer 10. The second direction in which the dopant ions are thus injected into each of the active areas also has on the plane parallel with the surface of the silicon wafer 10 a projective component angled to or, in other words, not parallel with the direction of length of the gate electrode layer G in every one of the active areas 20a, 20b, 20c and 20d of the silicon wafer 10 as indicated by arrow "B". Furthermore, the projective component of the second direction is diametrically opposite to the projective component of said first direction. During the second step of ion implantation, dopant ions are injected, for each of the transistors to be fabricated, with a dose equal to the remaining half of the total dose required for the formation of the source and drain regions for the field-effect transistor. Thus, dopant ions of the required dose can be injected into the source-forming and drain-forming regions S and D of each of the active areas 20a, 20b, 20c and 20d as a result of the first and second steps of ion implantation.

Preferably, the first and second directions in which dopant ions are to be injected into the silicon wafer 10 are selected such that the projective component of each of the first and second directions is inclined through 45 degrees from the direction of length of the gate electrode layer G in each of said active areas as indicated in FIG. 2.

The dopant ions being thus injected into the silicon wafer 10 in the first and second directions having their respective projective components diametrically opposite to each other, dopant ions are injected into the total areas of the source-forming and drain-forming regions S and D within each of the active areas of the silicon wafer 10. Accordingly, a semiconductor integrated circuit device fabricated by a process according to the present invention features uniformity of performance characteristics among the individual MOS field-effect transistor devices formed on the silicon wafer and symmetrical source and drain performance characteristics in each of the transistor devices. It may be also noted that a process according to the present invention can be carried out with use of a simple and economical fabrication system not including means for driving a wafer during ion implantation.

What is claimed is:

1. A process of fabricating a semiconductor integrated circuit device, comprising the steps of
    (a) forming on a semiconductor wafer a plurality of active areas which are electrically isolated from each other,
    (b) forming on said semiconductor wafer a gate insulator layer located within each of said active areas, said gate insulator layer defining source-forming and drain-forming regions to form source and drain regions, respectively, on both sides of the gate insulator layer,
    (c) forming a gate electrode layer on said gate insulator layer within each of said active areas, and
    (c) introducing dopant ions selectively into said source-forming and drain-forming regions with said gate electrode layer used as a mask for thereby forming said source and drain regions, respectively, within each of said active areas, wherein said dopant ions are selectively introduced into said source-forming and drain-forming regions in consecutive two steps which consist of
    (d/1) a first step of introducing dopant ions into said source-forming and drain-forming regions within each of said active areas in a first direction inclined through a predetermined angle from normal to the surface of the semiconductor wafer, the first direction having on a plane parallel with the surface of the semiconductor wafer a projective component angled to the direction of length of the gate electrode layer in each of said active areas, the dopant ions being introduced into said source-forming and drain-forming regions in said first direction with a dose substantially equal to one half of the total dose required for the formation of the source and drain regions, and
    (d/2) a second step of introducing dopant ions into said source-forming and drain-forming regions within each of said active areas in a second direction inclined through said predetermined angle from normal to the surface of the semiconductor wafer, the second direction having on said plane parallel with the surface of the semiconductor wafer a projective component angled to the direction of length of the gate electrode layer in each of said active areas and diametrically opposite to the projective component of said first direction, the dopant ions being introduced into said source-forming and drain-forming regions in said second direction with a dose substantially equal to the remaining half of said total dose required for the formation of the source and drain regions, wherein the projective component of each of said first and second directions is inclined through 45 degrees from the direction of length of the gate electrode layer in each of said active areas.

2. A process as set forth in claim 1, in which said dopant ions are supplied from a source of dopant ions fixedly held in position with respect to said semiconductor wafer during each of said first and second steps and in which, upon termination of said first step, the relative position between said semiconductor wafer and the source of dopant ions is inversed in diametrically opposite relationship.

3. A process as set forth in claim 2, in which, upon termination of said first step, said semiconductor wafer is turned through 180 degrees with respect to the source of dopant ions with the source of dopant ions fixedly held in situ.

4. A process of fabricating a semiconductor integrated circuit device, comprising the steps of
   (a) forming on a semiconductor wafer a plurality of active areas which are electrically isolated from each other,
   (b) forming on said semiconductor wafer a gate insulator layer located within each of said active areas, said gate insulator layer defining source-forming and drain-forming regions to form source and drain regions, respectively, on both sides of the gate insulator layer,
   (c) forming a gate electrode layer on said gate insulator layer within each of said active areas, and
   (d) introducing dopant ions selectively into said source-forming and drain-forming regions with said gate electrode layer used as a mask for thereby forming said source and drain regions, respectively, within each of said active areas, wherein said dopant ions are selectively introduced into said source-forming and drain-forming regions in consecutive two steps which consist of
   (d/1) a first step of introducing dopant ions into said source-forming and drain-forming regions within each of said active areas in a first direction inclined through a predetermined angle from normal to the surface of the semiconductor wafer, the first direction having on a plane parallel with the surface of the semiconductor wafer a projective component angled to the direction of length of the gate electrode layer in each of said active areas, the dopant ions being introduced into said source-forming and drain-forming regions in said first direction with a dose substantially equal to one half of the total dose required for the formation of the source and drain regions, and
   (d/2) a second step of introducing dopant ions into said source-forming and drain-forming regions within each of said active areas in a second direction inclined through said predetermined angle from normal to the surface of the semiconductor wafer, the second direction having on said plane parallel with the surface of the semiconductor wafer a projective component angled to the direction of length of the gate electrode layer in each of said active areas and diametrically opposite to the projective component of said first direction, the dopant ions being introduced into said source forming and drain-forming regions in said second direction with a dose substantially equal to the remaining half of said total dose required for the formation of the source and drain regions, wherein the projective component of each of said first and second directions is inclined a predetermined angle greater than zero from the direction of length of the gate electrode layer in each of said active areas.

* * * * *